United States Patent [19]

Tanaka et al.

[11] 4,293,931

[45] Oct. 6, 1981

[54] MEMORY REFRESH CONTROL SYSTEM

[75] Inventors: Yoshikazu Tanaka, Kawasaki; Hitoshi Shirai; Yoshiharu Kan'o, both of Yokohama, all of Japan

[73] Assignee: Fujitsu Limited, Kawasaki, Japan

[21] Appl. No.: 135,184

[22] Filed: Mar. 28, 1980

[30] Foreign Application Priority Data

Apr. 2, 1979 [JP] Japan .................................. 54-39550

[51] Int. Cl.$^3$ ............................................. G11C 7/00
[52] U.S. Cl. .................................... 365/222; 365/233
[58] Field of Search ........................ 365/222, 230, 233

[56] References Cited

U.S. PATENT DOCUMENTS

| | | | |
|---|---|---|---|
| 3,684,897 | 8/1972 | Anderson et al. ................... | 365/222 |
| 3,902,082 | 8/1975 | Proebsting et al. .................. | 365/230 |
| 4,084,154 | 4/1978 | Panigrahi ............................ | 365/222 |

*Primary Examiner*—Stuart N. Hecker
*Attorney, Agent, or Firm*—Staas & Halsey

[57] ABSTRACT

In a memory refresh control system for refresh control of a memory having, as refresh addresses, addresses respectively corresponding to combinations of $n+N$ bits, there are provided a refresh control circuit which yields, as refresh addresses, addresses respectively corresponding to combinations of n bits and generates, in a certain period of time, refresh clocks respectively corresponding to the abovesaid addresses for specifying $2^n$ refresh times, a circuit which divides each of the refresh clock into $2^N$ in terms of time and an overhead bit generator which is supplied with the divided clocks to produce successively addresses respectively corresponding to combinations of N bits for each divided clock. The n bits available from the refresh control circuit are added with the N bits generated by the overhead bit generator and then applied as an address of $n+N$ to a memory, which is refreshed by the divided clock. The refresh clock divider is composed of monostable multivibrators of suitable time constants, and the overhead bit generator is formed by a counter.

10 Claims, 6 Drawing Figures

MEMORY REFRESH CONTROL SYSTEM

BACKGROUND OF THE INVENTION

This invention relates to a memory refresh control system, and more particularly to a refresh control system for memories using dynamic random access memory elements, such as MOS transistors and the like.

Recently, development of such memories shows a tendency to increase their storage capacity. An increase in the storage capacity causes an increase in the number of refresh addresses. A conventional refresh control method for such memories produces, as refresh addresses, addresses respectively corresponding to combinations of n bits in a refresh control circuit, generates, in a limited period of time, refresh clocks corresponding to the respective addresses for specifying $2^n$ refresh times, and applies the address information and the refresh clocks directly to memory elements to be refreshed.

If the abovesaid prior art refresh control method is applied to a mass storage device with an increased number of refresh addresses, it is necessary that the number of refresh clocks to be sent out in the limited period of time P be increased in correspondence to the increased number of refresh addresses. This inevitably requires a longer refresh time, resulting in reduced efficiency of utilization of the storage device. Further, since the number of bits constituting refresh address data increases, it is required to increase the number of bits for the refresh address data which are sent out from a refresh control circuit provided in a central processor unit. To this end, the central processor unit must be equipped with different interfaces for memories with different numbers of refresh addresses.

SUMMARY OF THE INVENTION

It is an object of the present invention to provide a memory refresh control system which enables constant refresh control of a memory without any modification of the arrangement of the refresh control system of the central processor unit or the like, even if the number of refresh addresses of the memory is increased, for example, from $2^n$ to $2^{n+N}$.

Another object of the present invention is to provide a memory refresh control system, which permits memory refresh control that maintains a high utilization efficiency, without increasing the number of refresh clocks from a refresh control circuit within a limited period of time, even if the number of refresh addresses of the storage device is increased.

Another object of the present invention is to provide a memory refresh control system which employs a refresh control circuit for generating, as refresh addresses, data corresponding to respective combinations of n bits, and for setting up in a limited period of time $2^n$ refresh times (refresh clocks) corresponding to the abovesaid respective addresses; a circuit for dividing each of the refresh clocks, down to $2^N$ sub-intervals without modification of the control circuit; and a circuit for producing data, corresponding to respective combinations of N bits, through utilization of the sub-intervals, in order to achieve refresh control of a memory requiring, as refresh addresses, addresses corresponding to respective combinations of $n+N$ bits.

Yet another object of the present invention is to provide a memory refresh control system which permits refresh control of a memory requiring refresh addresses of $n+N$ bits in the same refresh time as is needed for a memory that can be refreshed with n-bit refresh addresses, thereby avoiding reduction of the utilization efficiency of the memory and the throughput of a central processor unit.

Other objects, features and advantages of the present invention will hereinafter become more fully apparent from the following description taken in conjunction with the accompanying drawings, which illustrate preferred embodiments of the invention.

DESCRIPTION OF THE PREFERRED EMBODIMENTS

Figure 1:
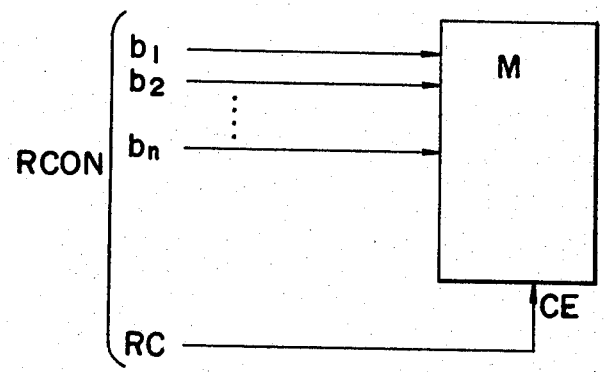
FIG. 1 is a connection diagram showing a conventional memory refresh control system.
Figure 2:
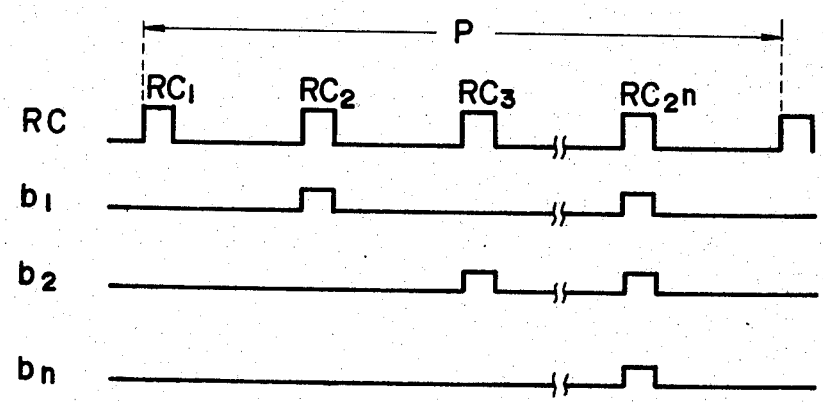
FIG. 2 is a timing chart explanatory of the operation of the system shown in FIG. 1.

FIG. 1 is a connection diagram showing a memory refresh control system heretofore employed, and FIG. 2 is a timing chart showing its operation. In FIG. 1, reference numeral M indicates a memory, which has $2^n$ refresh addresses. Each refresh address must be refreshed within a limited period of time P, for example, 2 ms.

In this case, a central processor or the like is provided with a refresh control circuit RCON, which yields $2^n$ refresh addresses respectively corresponding to combinations of n bits $b_1, b_2, \ldots b_n$, and $2^n$ refresh clocks $RC_1, RC_2, \ldots RC_{2^n}$ corresponding to the refresh addresses, in the limited period of time P. The memory M is subjected to refresh control by the refresh control circuit RCON.

In FIG. 1, reference character RC indicates a refresh clock input terminal, to which refresh clocks $RC_1, RC_2, RC_3, \ldots RC_{2^n}$ are applied from the refresh control circuit RCON within the limited period of time P, as shown in FIG. 2; and $b_1, b_2, \ldots b_n$ designate bits constituting refresh address data, which are assigned by the refresh control circuit RCON for each refresh clock. That is, as exemplified in FIG. 2, during of the refresh clock $RC_1$ refresh address data $0, 0, \ldots 0$ ($b_1=0, b_2=0, \ldots b_n=0$) is provided; during the refresh clock $RC_2$ refresh address data $1, 0, \ldots 0$ is provided; during the refresh clock $RC_3$ refresh address data $0, 1, 0, \ldots 0$ is provided; and during the last refresh clock $RC_{2^n}$ refresh address data $1, 1, \ldots 1$ is provided. The refresh clocks $RC_1$ to $RC_{2^n}$ are supplied to a chip enable terminal CE of the memory M, and refresh takes place in the time designated by each refresh clock. The above operation is repeated. As described above, the refresh clocks $RC_1, RC_2, RC_3, \ldots RC_{2^n}$ corresponding in number to refresh addresses of the memory M are provided thereto to refresh each of the refresh addresses in the respective period of time specified by one of the refresh clocks.

In the above, as the memory capacity of the memory M increases, the number of refresh addresses also increases. In this case, if the aforementioned conventional refresh control system is employed, then it is necessary that the number of refresh clocks to be sent out within the limited period of time P be increased corresponding to the increased number of refresh addresses. This inevitably leads to longer refresh time and reduced utilization efficiency of the memory. Moreover, since the number of bits making up the refresh address data increases, it is necessary to increase the number of bits for the refresh address data which are sent out from the central processor unit. To this end, the central processor unit must be equipped with different interfaces for memories having different numbers of refresh addresses.

Figure 3:
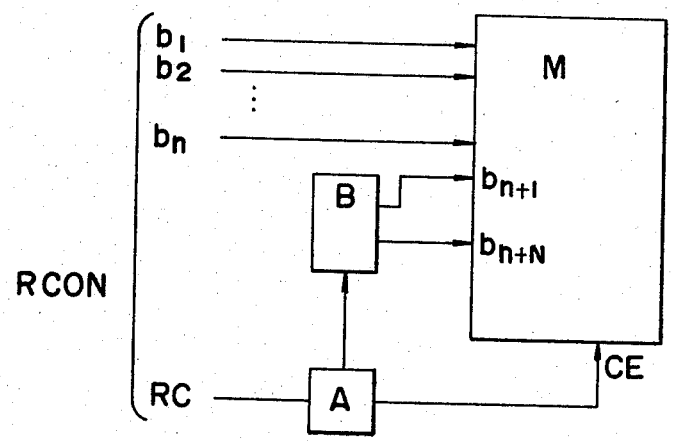
FIG. 3 is a connection diagram showing an embodiment of the present invention.

FIG. 3 is a connection diagram of a specific example of the present invention.

In FIG. 3, reference character M indicates a memory which must be refreshed and has $2^{n+N}$ refresh addresses. Their address data are provided as n+N bits $b_1$, $b_2$ to $b_n$ and $b_{n+1}$ to $b_{n+N}$. Reference character B designates a circuit for producing a part of the refresh address data, i.e. overhead bits $b_{n+1}$ to $b_{n+N}$; and A identifies a circuit for dividing each refresh clock into $2^N$ sub-intervals. The n bits $b_1$ to $b_n$ of the refresh addresses are derived from the refresh control circuit RCON of the central processor unit or the like, whereas the N overhead bits $b_{n+1}$ to $b_{n+N}$ are provided from the circuit B.

Figure 4:
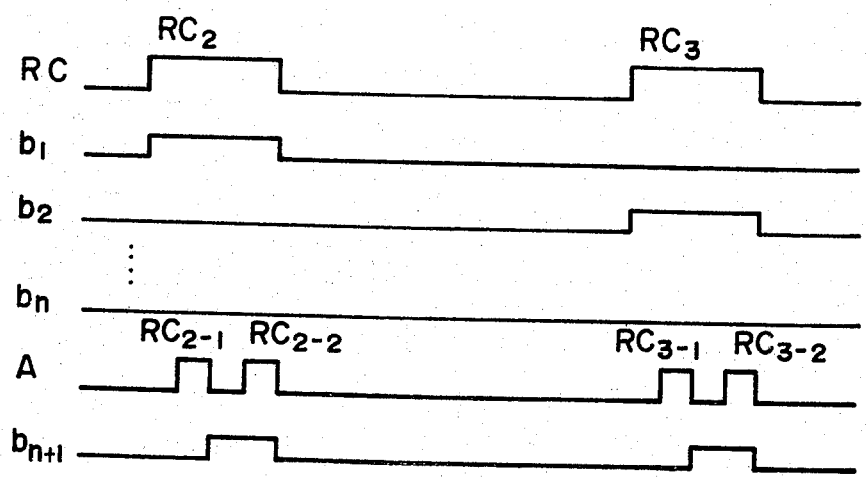
FIG. 4 is a timing chart explanatory of the operation of the embodiment depicted in FIG. 3.

FIG. 4 is a timing chart explanatory of the operation of the specific operative example shown in FIG. 3. As in the example of FIG. 3, there is provided from the refresh control circuit RCON, within the limited period of time P, $2^n$ refresh clocks, corresponding to the number of refresh addresses composed of the n bits $b_1$ to $b_n$, as with the conventional system shown in FIG. 1. In FIG. 4 there are shown on an enlarged scale the refresh clocks $RC_2$ and $RC_3$ in FIG. 2. FIG. 4 also shows the case where during the refresh clock $RC_2$ the bits $b_1$ to $b_n$ are provided in the form of 1, 0,0, ... 0 and during the refresh clock $RC_3$ the bits $b_1$ to $b_n$ are provided in the form of 0, 1,0, ... 0.

In this case, assuming that N=1 (one overhead bit), the refresh clocks $RC_2$, $RC_3$, ... supplied to the terminal RC of the refresh clock divider A are each divided by the divider A into $2^N$ (=$2^1$), that is, into two sub-intervals during each clock. In FIG. 4, line A shows the thus divided clocks $RC_{2-1}$, $RC_{2-2}$, $RC_{3-1}$, and $RC_{3-2}$.

When applied to the terminal RC, the refresh clock $RC_2$ is divided by the refresh divider A into clocks $RC_{2-1}$ and $RC_{2-2}$, which are fed to the circuit B. The circuit B has, for example, a binary counter for counting the clocks and provides the count result as a bit $b_{n+1}$. At the end of the preceding refresh clock ($RC_1$), the binary counter returns to zero and its output bit $b_{n+1}$ is zero. Accordingly, when the divided clock $RC_{2-1}$ is supplied from the divider A to the chip enable terminal CE of the memory M, an address specified by the refresh address data 1, 0, ... 0; 0 (the last bit 0 being $b_{n+1}$) is refreshed.

The binary counter of the circuit B counts 1 at the fall of the clock $RC_{2-1}$ and provides 1 as its output bit $b_{n+1}$. Accordingly, since 1, 0,0, ... 0 1 (the last bit 1 being $b_{n+1}$) is applied as the refresh address data, when the next clock $RC_{2-2}$ is applied to the chip enable terminal CE, the address assigned by the refresh address data is refreshed.

The binary counter of the circuit B counts the fall of the clock $RC_{2-2}$ and returns to zero.

Similarly, in the case of the refresh clock $RC_3$, addresses respectively corresponding to the address data 0, 1,0, ... 0 and 0, 1,0, ... 0,1 (each of the last bits 0 and 1 being the bit $b_{n+1}$) are refreshed.

In this way, all addresses corresponding to the combined data of n+1 bits ($b_1$ to $b_n$ and $b_{n+1}$) are refreshed by the refresh clocks $RC_1$ to $RC_{2^n}$, corresponding to all combinations of n bits, provided in a limited period of time.

In the above, N is assumed to be 1, but N can be made 2 or more by providing a $2^N$-step counter in the circuit B which produces its N output bits in correspondence to $b_{n+1}$ to $b_{n+N}$, and by dividing each refresh clock by the divider A into $2^N$. In other words, the number of refresh addresses can be increased twice, four times, .. . $2^N$ times.

Figure 5:
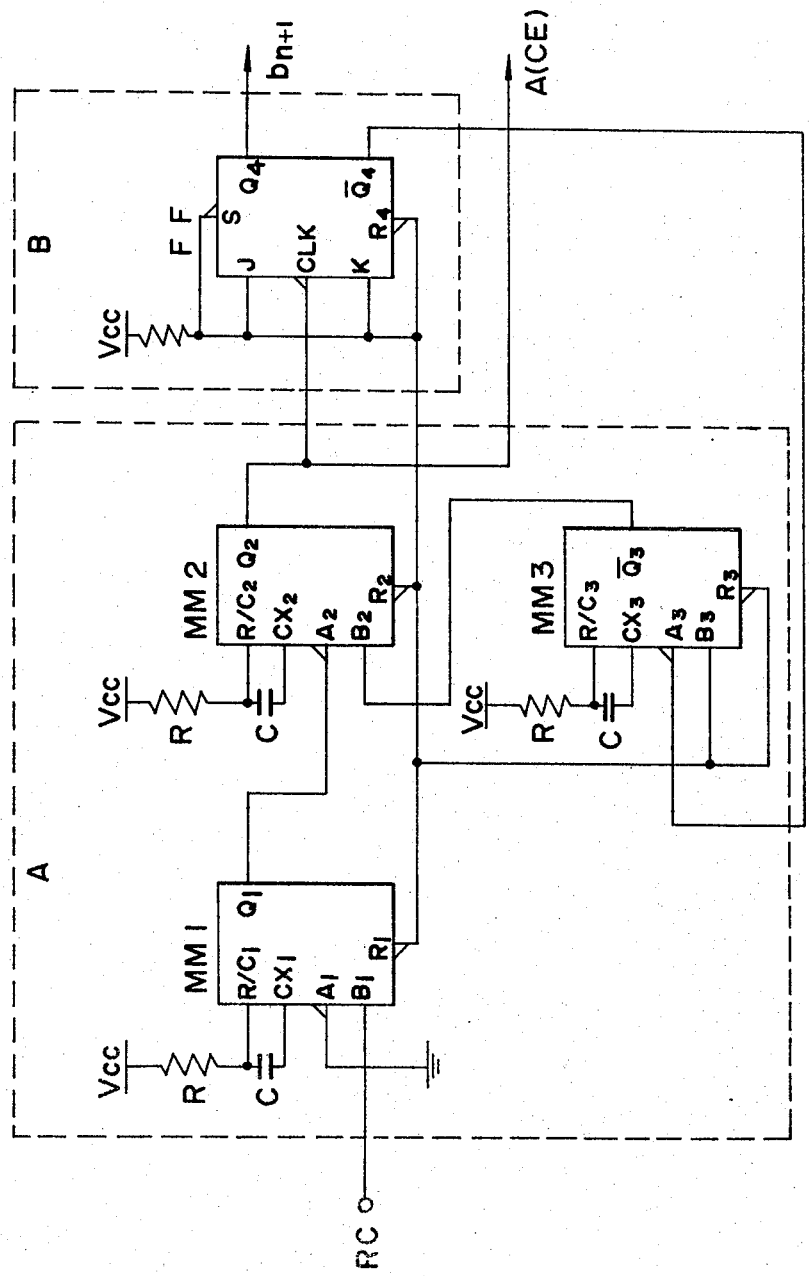
FIG. 5 is a circuit diagram showing in detail a specific example of the system shown in FIG. 3.
Figure 6:
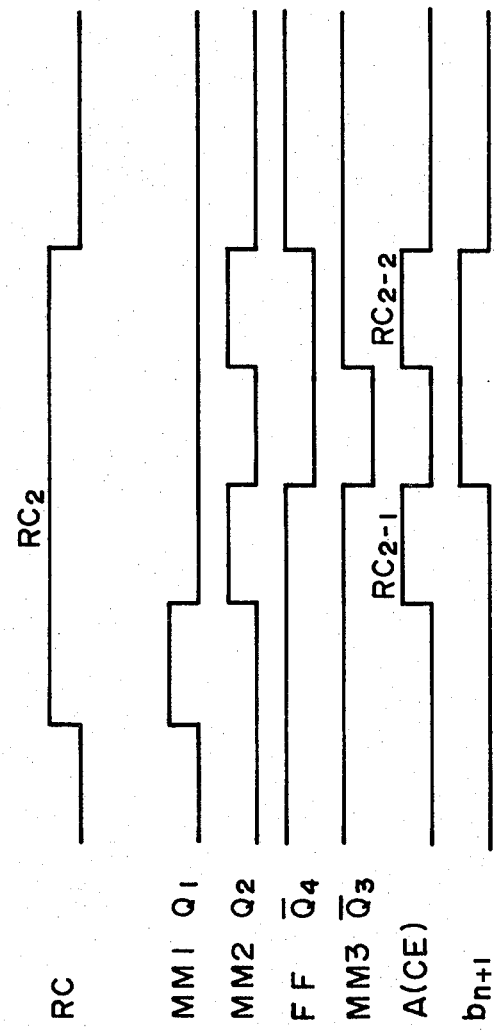
FIG. 6 is a timing chart explanatory of the operation of the circuit depicted in FIG. 5.

FIG. 5 is a detailed circuit diagram illustrating the circuit A, for dividing the refresh clock into two in terms of time, and the circuit B, for producing one overhead bit ($b_{n+1}$), in the case of N=1, that is, in the case of adding one bit to the n bits sent from the refresh control circuit RCON. FIG. 6 is a timing chart explanatory of the operation of the circuit of FIG. 5.

In FIG. 5, the circuit A is a circuit by which the refresh clocks $RC_1$, $RC_2$, ... $RC_{2^n}$ fed to the terminal RC from the refresh control circuit RCON are each divided into two in terms of time, and the circuit B is a circuit for producing one overhead bit $b_{n+1}$.

The circuit A is composed of three monostable multivibrators MM1, MM2, and MM3. When voltages at their input terminals $A_1$, $A_2$, and $A_3$ are low ("0"), the monostable multivibrators are each triggered by the rise of an input signal to each of their input terminals $B_1$, $B_2$, and $B_3$; and when the voltages at the input terminals $B_1$, $B_2$, and $B_3$ are high ("1"), the multivibrators are each triggered by the fall of an input signal to each of the input terminals $A_1$, $A_2$, and $A_3$. Upon triggering of the monostable multivibrators MM1, MM2, and MM3, outputs at their output terminals $Q_1$, $Q_2$, and $\overline{Q}_3$ are each inverted and then returned to their original state after certain periods of time which are respectively determined by capacitances C and resistors R respectively connected to terminals $R/C_1$, $R/C_2$, and $R/C_3$, and terminals $CX_1$, $CX_2$, and $CX_3$. Input terminals $R_1$, $R_2$, and $R_3$ are reset terminals but, in FIG. 5, they are always supplied with a high voltage from a power source Vcc and made inoperative.

The circuit B is formed as a 1-digit binary counter by one J-K flip-flop FF. The J-K flip-flop FF is supplied at each of its input terminals J and K, at set input terminal S, and at reset input terminal $R_4$ with a high voltage from the power source Vcc. The J-K flip-flop FF is designed to block inputs from these input terminals, invert the state of its output terminals $Q_4$ and $\overline{Q}_4$ at the fall of a clock input signal at its clock input terminal CLK, and maintain the inverted state until the next clock input signal falls.

Now, a description will be given, with reference to FIG. 6, of the operation of the circuit shown in FIG. 5.

A refresh control clock, when applied from the refresh control circuit RCON to the input terminal RC as indicated by $RC_2$ in FIG. 6, is fed first to the input terminal $B_1$ of the monostable multivibrator MM1 to trigger it at the rise of the refresh control clock $RC_2$, by which the output from the output terminal $Q_1$ is inverted from low to high level and then restored to the original state after a selected period of time. The time during which the voltage at the output terminal $Q_1$ is high is determined by the capacitor C and the resistor R respectively connected to the terminals $R/C_1$ and $CX_1$ of the monostable multivibrator MM1; but this time is selected so that bit information $b_1$ to $b_n$ and $b_{n+1}$ indicating a refresh address may be stably applied to the memory (M in FIG. 3). In FIG. 6, MM1Q$_1$ shows the output waveform occurring at the output terminal Q$_1$ of the monostable multivibrator MM1. Upon the fall of the output at the output terminal Q$_1$, at the selected period of time after triggering of the monostable multivibrator MM1, the monostable multivibrator MM2 is supplied at its input terminal A$_2$ with the output from the abovesaid output terminal Q$_1$, and hence is triggered and inverts the output at its output terminal Q$_2$ from its low to high level, and then restores the output to the original state after a selected period of time. The output at the output terminal Q$_2$ of the monostable multivibrator MM2 assumes a waveform such as indicated by MM2Q$_2$ in FIG. 6. The output at the output terminal Q$_2$ is applied as the divided refresh control clock RC$_{2-1}$ to the chip enable terminal CE of the memory M, as shown in FIG. 6, line A(CE), thus achieving refreshing. At this time, however, the output at an output terminal Q$_4$ of the J-K flip-flop FF is a low voltage, and the bit $b_{n+1}$ which is applied as an overhead bit of the refresh address from the output terminal Q$_4$ represents "0". The J-K flip-flop FF of the circuit B serves as a 1-digit binary counter and counts the falls of input signals, and when two falls are counted, the output at the output terminal Q$_4$ returns to "0".

The capacitor C and resistor R are selected so that the period of time during which the output at the output terminal Q$_2$ of the monostable multivibrator MM2 remains high in level is sufficient for the memory M to complete its refreshing.

When the output at the output terminal Q$_2$ of the monostable multivibrator MM2 retuns to the low level after the above period of time, that is, when the refresh clock RC$_{2-1}$ ends, since the signal to the input terminal CLK falls (from the high to the low level), the J-K flip-flop FF inverts its state, inverting the output voltages at its output terminals Q$_4$ and $\overline{Q}_4$. The overhead bit $b_{n+1}$ provided in the form of "0" (a low voltage) from the output terminal Q$_4$ of the J-K flip-flop FF becomes "1" (a high voltage), whereas the output at the output terminal $\overline{Q}_4$ changes from a high voltage to a low one. In FIG. 6, FF$\overline{Q}_4$ shows the output waveform occurring at the output terminal $\overline{Q}_4$ of the J-K flip-flop FF, and $b_{n+1}$ shows the output waveform at the output terminal Q$_4$.

Since the input to the input terminal B$_3$ of the monostable multivibrator MM3 of the circuit A is held by the power source Vcc at the high level and falls due to the output inversion at the output terminal $\overline{Q}_4$ of the J-K flip-flop FF, the monostable multivibrator MM3 is triggered. The output at its output terminal $\overline{Q}_3$ changes from high to low level, and returns to the high level after the selected period of time determined by the capacitor C and the resistor R respectively connected to the terminals R/C$_3$ and CX$_3$. This selected period of time is selected to permit stable application of the refresh address to the memory M.

When the monostable multivibrator MM3 is restored after the lapse of the abovesaid selected period of time, the input to the input terminal B$_2$ of the monostable multivibrator MM2 rises and the monostable multivibrator MM2 is triggered again. The output at the output terminal Q$_2$ changes from low to high level and remains high for a certain period of time, and the high-level output is provided as the refresh control clock CR$_{2-2}$ to the chip enable terminal CE of the memory M. At this time, "1" is sent out as the overhead bit $b_{n+1}$, as described previously.

In FIG. 6, A(CE) shows the signal waveform which is supplied to the chip enable terminal CE of the memory M from the circuit A. Since the signal to the chip enable terminal CE is branched from the output of the output terminal Q$_2$ of the monostable multivibrator MM2, the former has the same waveform as that of the latter. Further, $b_{n+1}$ shows a waveform which is sent out as the overhead bit from the output terminal (indicated by $b_{n+1}$) of the circuit B. The waveforms A(CE) and $b_{n+1}$ are identical with those of the corresponding signals A and $b_{n+1}$ in FIG. 4.

The time constants of the monostable multivibrators MM1, MM2 and MM3 are set so that the second divided refresh clock RC$_{2-2}$ may end when the refresh clock RC$_2$ ends.

In the cae of N>1, use is made of a circuit A formed as an N-stage divider by cascade-connecting N circuits which are each similar in construction to the above-described circuit A except that the monostable multivibrators in each circuit have smaller time constants, respectively $\frac{1}{2}$ to $\frac{1}{2}$N times those in circuit A. A circuit B is formed as a $2^N$-step counter by cascade-connecting N circuits which are identical in construction with the above-described circuit B. This circuit arrangement is applicable to the case of N overhed bits $b_{n+1}$ to $b_{n+N}$.

In the above embodiment, monostable multivibrators and a J-K flip-flop are combined to obtain the waveforms shown in FIG. 6, but the monostable multivibrators may also be replaced with a delay line or gate delay.

Numerous changes may be made in the above-described system, and different embodiments of the invention may be made without departing from the spirit thereof; therefore, it is intended that all matter contained in the foregoing description and in the accompanying drawings shall be interpreted as illustrative and not in a limiting sense.

What is claimed is:

1. A memory refresh control system comprising:
    refresh control circuit means for generating refresh addresses respectively corresponding to combinations of n bits, and for producing in a limited period of time $2^n$ refresh clocks corresponding to said refresh addresses;
    means for dividing each of said refresh clocks into $2^N$ sub-intervals; and
    overhead bit generator means, supplied with said sub-intervals, for yielding successive N bit outputs respectively corresponding to all combinations of N bits, for each sub-interval;
    wherein the n bits available from said refresh control circuit means are conjoined with said N bit outputs generated by the overhead bit generator means, and are provided as a refresh address corresponding to the respective sub-interval.

2. A memory refresh control system according to claim 1, wherein said refresh clock dividing means comprises a plurality of monostable multivibrators.

3. A memory refresh control system according to claim 1, wherein said overhead bit generator means comprises a counter which is restored to zero after counting clocks corresponding in number to the overhead bits.

4. An expanded refresh control system, for expanding by a factor of $2^N$ the space of memory addressed by refresh addresses received with corresponding refresh clocks, comprising:

means for receiving the refresh clocks and the corresponding refresh addresses;

means, operatively connected to said receiving means, for generating and outputting $2^N$ approximately equal sub-intervals during each refresh clock; and means, operatively connected to said receiving means, for generating $2^N$ N-bit overhead addresses during each refresh clock, for combining each said overhead address with the refresh address corresponding to the refresh clock, and for outputting each such combination as an expanded address.

5. The refresh control system of claim 4, wherein said respectively expanded addresses are outputted in correspondence to said respective sub-intervals.

6. The refresh control system of claim 5, wherein said overhead address and said refresh address are combined by forming an expanded address whereof the last N bits are identical to said overhead address and all other bits are identical to said refresh address.

7. The refresh control system of claim 6, wherein said overhead address generating means comprises a counter.

8. The refresh control system of claim 7, wherein said sub-interval generating means comprises N stages, each said stage comprising an input and an output, wherein said input of said first stage is operatively connected to said refresh clock receiving means, wherein said inputs of second and subsequent ones of said stages are respectively operatively connected to said output of said respective preceding stage, wherein said output of said N-th stage comprises the output of said sub-interval generating means, and wherein each particular one of said stages comprises:

first, second, and third multi-vibrator means for producing, when triggered, respective pulses each having a width approximately equal to one quarter of the width of the pulses received at the input of said particular stage, wherein said first multivibrator is connected to said input of said particular stage and triggered by the rise of pulses received at said input, wherein said second multivibrator is connected to said first multivibrator and triggered by the fall of the said pulses produced by said first multivibrator, wherein said third multivibrator is connected to said second multivibrator and triggered by the fall of said pulses produced by said second multibivrator when said second multivibrator is triggered by said first multivibrator, wherein said second multivibrator is also connected to said third multivibrator and is also triggered by the fall of the pulses produced by said third multivibrator, and wherein the output of said second multivibrator provides the output of said particular stage.

9. The refresh control system of claim 8, wherein N is equal to one, and wherein said counter comprises a flip-flop.

10. The refresh control system of claim 8, wherein said first, second, and third multi-vibrator means of each said particular stage each comprises a capacitor and a resistor, the time constant of said capacitor in combination with said resistor being selected in accordance with the width of said respective pulses of said respective multi-vibrator means of each said particular stage.

* * * * *

UNITED STATES PATENT AND TRADEMARK OFFICE
CERTIFICATE OF CORRECTION

PATENT NO. : 4,293,931
DATED : October 6, 1981
INVENTOR(S) : TANAKA ET AL.

It is certified that error appears in the above—identified patent and that said Letters Patent is hereby corrected as shown below:

```
Front page, Abstract:
     line 11, "clock" should be --clocks--;
     line 18, after "n+N", insert --bits--.
Column 1, between lines 4 and 5, insert
     --1. Field of the Invention--;
     between lines 8 and 9, insert
     --2. Description of the Prior Art--;
     line 17, the "2" in "2ⁿ" should be in regular type.
Column 2, line 49, delete "of";
     line 52, "1" should be in regular type;
     line 56, "refresh" should be --refreshing--.
Column 3, line 56, ";" should be --,--;
     lines 58, 59 and 60, the heavy-type "1" should be
          in regular type;
     line 60, "0 1" should be --0, 1--.
Column 4, line 1, "0" should be in regular type;
     line 2, "1" should be in regular type.
Column 5, line 35, "retuns" should be --returns--;
     line 40, "Q₄" (second occurrence) should be --Q̄₄--.
Column 6, line 19, "cae" should be --case--.
```

Signed and Sealed this

Thirtieth Day of March 1982

[SEAL]

Attest:

GERALD J. MOSSINGHOFF

Attesting Officer     Commissioner of Patents and Trademarks